United States Patent [19]

Ennis et al.

[11] Patent Number: 4,540,904
[45] Date of Patent: Sep. 10, 1985

[54] TRI-STATE TYPE DRIVER CIRCUIT

[75] Inventors: John J. Ennis, Corona; Robert K. Booher, Temecula, both of Calif.

[73] Assignee: The United States of America as represented by the Secretary of the Air Force, Washington, D.C.

[21] Appl. No.: 491,108

[22] Filed: May 3, 1983

[51] Int. Cl.³ ............... H03K 19/094; H03K 17/284; H03K 19/20; H03K 3/037
[52] U.S. Cl. ............................. 307/473; 307/247 R; 307/585; 307/270
[58] Field of Search .......... 307/445, 451, 473, 247 R, 307/576, 579, 585, 270

[56] References Cited

U.S. PATENT DOCUMENTS

| | | | |
|---|---|---|---|
| 3,906,255 | 9/1975 | Mensch, Jr. | 307/473 X |
| 4,280,065 | 7/1981 | Minato et al. | 307/473 |
| 4,350,906 | 9/1982 | Gillberg | 307/473 X |
| 4,363,978 | 12/1982 | Heimbigner | 307/473 X |
| 4,465,945 | 8/1984 | Yin | 307/270 X |

FOREIGN PATENT DOCUMENTS

| | | | |
|---|---|---|---|
| 154942 | 9/1982 | Japan | 307/473 |
| 181231 | 11/1982 | Japan | 307/473 |

OTHER PUBLICATIONS

Askin et al., "Off-Chip Driver", IBM TDB, vol. 21, No. 3, pp. 1044-1048, 8/1978.
Griffin et al., "High Speed Complementary Driver Circuit", IBM TDB, vol. 24, No. 5, pp. 2558-2559, 10/1981.

Primary Examiner—Larry N. Anagnos
Attorney, Agent, or Firm—Donald J. Singer; Bernard E. Franz

[57] ABSTRACT

An FET complementary pair provides the output to a data line. A data input line is coupled to the gate of the P-FET via an OR gate configuration, and to the gate of the N-FET via an AND gate configuration. The output of each gate configuration is cross-connected to an input of the other. When the input data state changes, the two gate configurations provide delays which are effectively in tandem, so that the FET which was ON is first turned OFF, and after a short delay the other is turned ON. This delay ensures that both FET's are not ON at the same time, which prevents an undesirable power flow. To provide a high impedance "float" state, an enable input and its complement are connected to the AND and OR gate configurations respectively.

1 Claim, 8 Drawing Figures

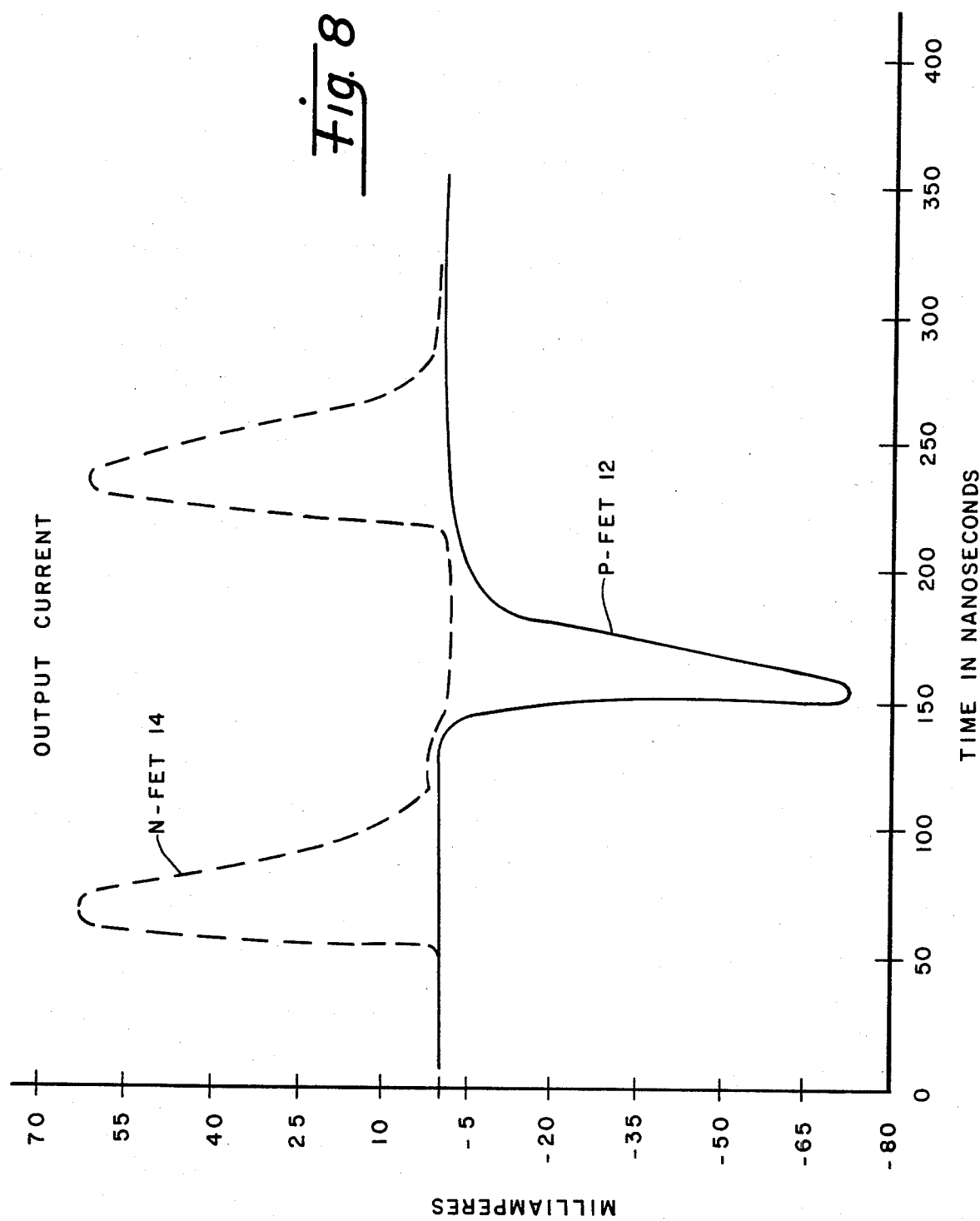

TRI-STATE TYPE DRIVER CIRCUIT

RIGHTS OF THE GOVERNMENT

The invention described herein may be manufactured and used by or for the Government of the United States for all governmental purposes without the payment of any royalty.

BACKGROUND OF THE INVENTION

This invention relates to tri-state digital logic using nonlinear solid state device circuits in electrical transmission or interconnection systems; and more particularly to a semiconductor driver circuit which is based on complementary metal insulatoroxide (CMOS) field effect transistors, the driver being of the three-state type which assumes the three values of logic "zero," "one," and "float."

In systems in which digital data is transmitted bidirectionally between units of a system, or several units are interconnected via a common bus, there are two or more drivers and receivers coupled to each transmission conductor. It is then required that not more than one driver be active at any time to send a sequence of "zeros" and "ones". It is desirable that the output of other drivers be in a high-impedance "float" state to avoid undue loading of the active driver. Such driver circuits are well known as shown for example in U.S. Patents to Minato et al U.S. Pat. No. 4,280,065, Suzuki et al U.S. Pat. No. 4,217,502, Ferris U.S. Pat. No. 4,311,927 and Aoki U.S. Pat. No. 3,602,733. All of these show complementary semiconductor devices in series between the two poles of a direct current supply, with the output taken at the junction of the two devices. One of the devices is turned on to send a "one" and the other to send a "zero," while both are turned off for "float." A problem is that during the transition between "ones" and "zeros," both devices may momentarily be on at the same time, which causes a large drain on the power supply.

SUMMARY OF THE INVENTION

An object of the invention is to prevent undesired power consumption on the output stage of tri-state drivers.

The tri-state drivers each comprise two complementary semiconductor devices in series, with a data output terminal at their junction connected to a data transmission conductor. According to the invention, an OR gate configuration has its output connected to the input of one of the driver devices, an AND gate configuration has its output connected to the input of the other driver device, a data input terminal is connected to an input of each gate configuration, and the output of each gate configuration is cross coupled to an input of the other. With this circuit arrangement, when the signal at the data input terminal changes state, the output of one gate configuration changes state first, which enables the other gate configuration to change state after some delay, so that both driver devices will not be on at the same time. To provide the "float" state, an enable signal lead is connected to a third input of one gate configuration, and inverted as a third input of the other gate configuration.

BRIEF DESCRIPTION OF THE DRAWING

FIGS. 5–8 are graphs showing actual operation of a driver.

DETAILED DESCRIPTION

Figure 1:
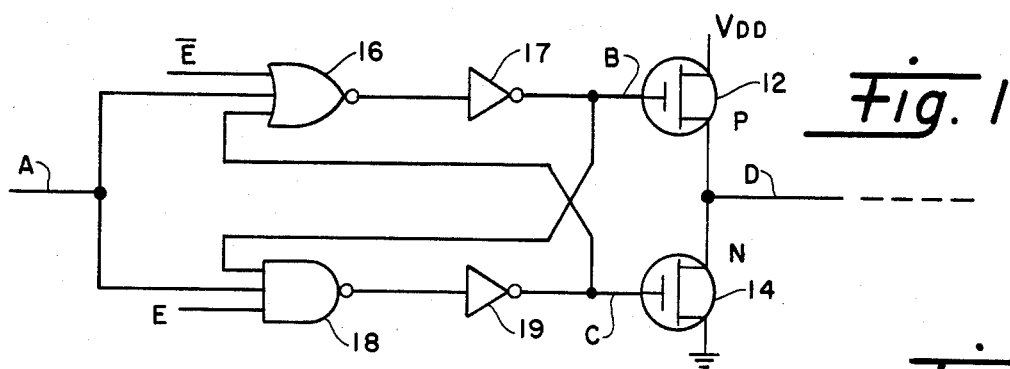
FIG. 1 is a functional block and schematic diagram of one driver circuit according to the invention.

The tristate driver circuit, as shown in FIG. 1, comprises two CMOS field effect transistors. The drain terminals of the two transistors are connected together to a transmission line conductor D. The source terminal of the P-type transistor 12 is connected to a positive direct current supply $V_{DD}$, and the source terminal of the N-type transistor is connected to ground. An input data point A is coupled via an OR configuration comprising NOR gate 16 and inverter 17 to point B at the gate terminal of the P-FET 12, and point A is also coupled via an AND configuration comprising a NAND gate 18 and an inverter 19 to point C at the gate terminal of the N-FET 14. Points B and C are cross connected to inputs of gates 18 and 16 respectively. To provide the float state, an enable line E and its inverse $\bar{E}$ are connected respectively to inputs of gates 18 and 16.

During the normal idle condition of the driver, the signal on line E is low (zero) making $\bar{E}$ high (one), so that point B is high and point C is low. Then both FET's 12 and 14 are biased to cutoff. In this state the FET's have a high impedance, but there is some leakage current flow through them from the DC supply $V_{DD}$ to ground, and line D assumes an intermediate potential. However, if another driver connected to the same line becomes active, its low impedance overrides the float condition.

Figure 2:
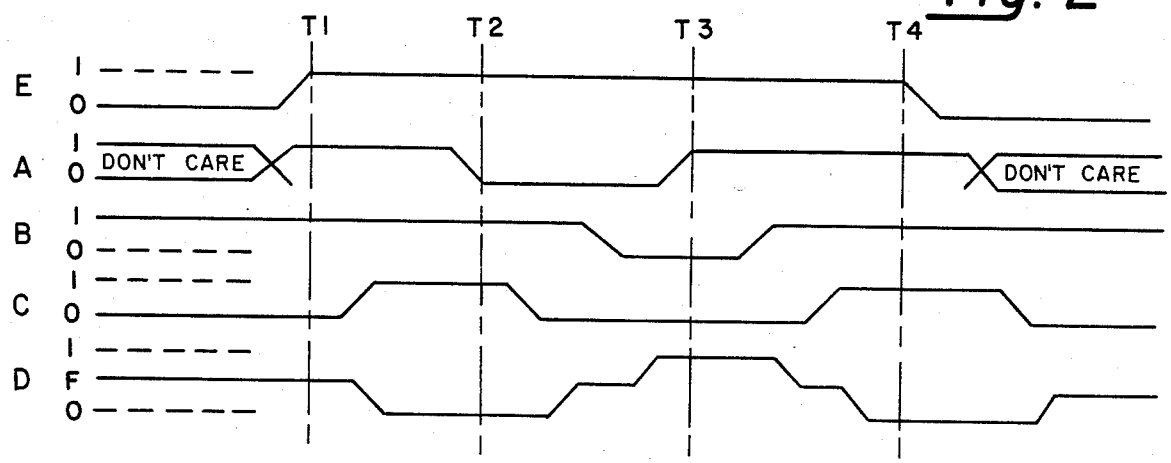
FIG. 2 is a timing diagram for FIG. 1.

The operation of the driver is illustrated by a timing diagram in FIG. 2. The logic levels are defined as "one" or "high" being a positive voltage $V_{DD}$, "zero" or "low" being ground potential, and "float" being a high impedance intermediate potential. At the left in FIG. 2 is the initial float state, with $\bar{E}$ a "one" and E a "zero". The signal level at point A is shown as "don't care," since it has no effect on the outputs of the gates. As long as the signal at $\bar{E}$ is a "one", the OR logic determines that point B will be a "one," and with a "zero" at E the AND logic determines that point C will be a "zero." The P-FET 12 has a potential $V_{DD}$ at both gate and source, while the N-FET 14 has ground potential at both gate and source, so that both are biased to cutoff.

The interval T1-T2 shows the situation after the enable signal at lead E becomes a "one" and the data input at point A is a "one". The OR logic 16-17 has a "one" input at A, so that point B remains a "one", and the P-FET 12 remains off. The AND logic now has all three inputs at "one," so point C becomes a "one" after a short delay. This turns on the N-FET 14 and drives the output at line D to "zero".

The interval T2-T3 shows the case of the data input at A changing from "one" to "zero." Although the A input of the OR logic 16-17 becomes a "zero," the C input is still a "one," so point B remains at "one." Since the AND logic 18-19 has a "zero" input at A, after a short delay the signal at point C becomes a "zero." This turns off the N-FET 14. The OR logic 16-17 now has all three inputs at "zero," so that after a further delay point B becomes a zero. This turns the P-FET 12 on and drives the signal on line D to a "one." Thus there is a definite short interval in the transition during which both FET's are off.

The interval T3-T4 shows the case of the data at input A changing from "zero" to "one". The A input of the AND logic 18-19 becomes a "one," but the B input is still a "zero," so point C remains at "zero." The A input of the OR logic becoming a "one," after a short delay, causes the signal at point B to become a "one." This turns off the P-FET 12. The AND logic 18-19 now has all three inputs at "one", and after a further delay the signal at point C becomes a "one." This turns the N-FET 14 on and drives the signal on line D to a "zero." Thus again there is a definite short interval in the transition during which both FET's are off.

The interval following time T4 shows the case of the enable signal at E becoming a zero at the completion of the data transmission. In the situation shown, the "one" at $\overline{E}$ maintains the signal at point B at a "one", regardless of any subsequent logic level at the data input point A, so that the P-FET 12 remains off. The "zero" input at E, via the AND logic 18-19, changes the signal at point C to a "zero" to turn off the N-FET 14. The output on line D is now again at "float."

In the case, not shown in FIG. 2, in which the enable signal at lead E becomes a "zero" at the end of a "zero" at the data input at A, the AND logic 18-19 maintains point C at a "zero," and the N-FET 14 remains off. The "one" at $\overline{E}$, via the OR logic 16-17, causes the signal at point B to become a "one", which turns off the P-FET 12, and places the output D at "float."

Figure 3:
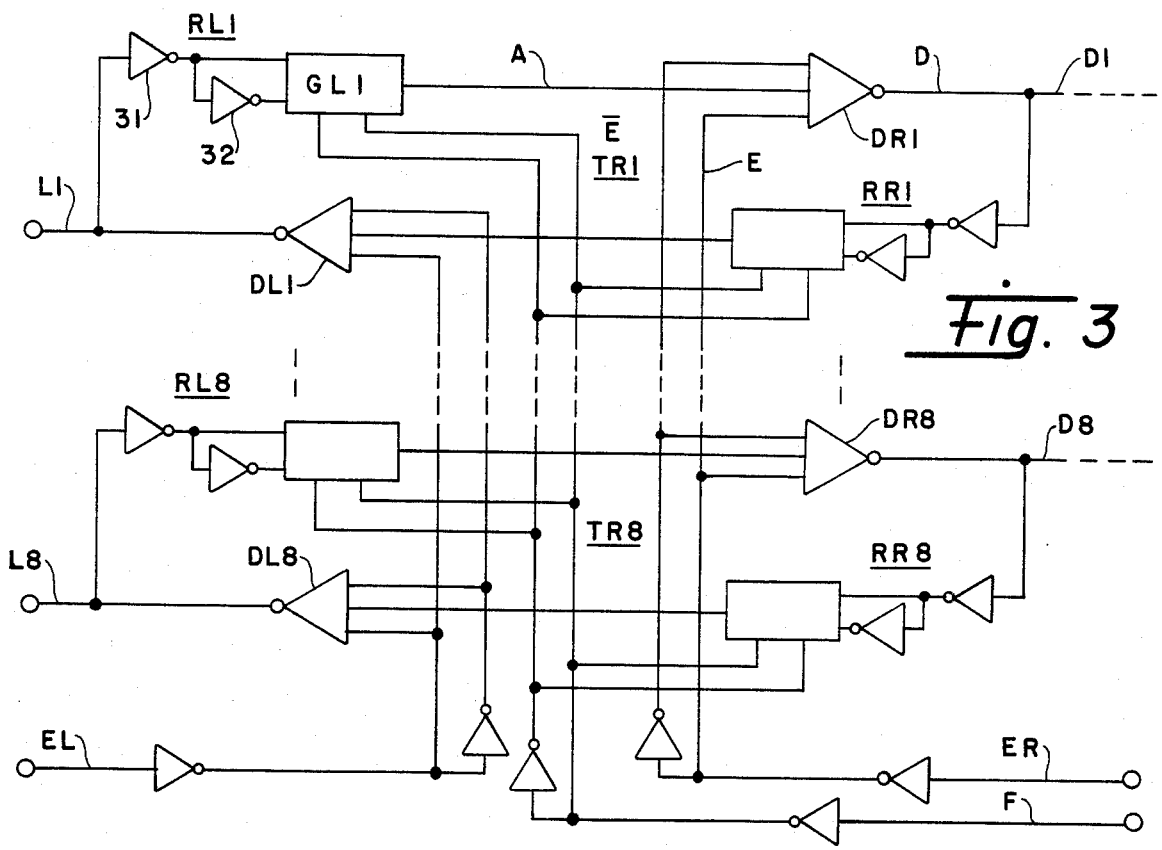
FIG. 3 is a functional block diagram of an eight-bit parallel transceiver.

FIG. 3 is a functional block diagram of a memory transceiver for one unit of a system, which transfers eight bits of data in parallel. In the memory transceiver there are eight bits or stages to one chip. It may for example be located between eight local terminals L1 to L8 at the left and eight conductors D1 to D8 of a data line or bus at the right. There is at least one other unit of the system with a similar transceiver connected to conductors D1 to D8. Only one transceiver on the same bus or two-way data transmission line is allowed to have its driver outputs to that line active at any one time, and the others must be at "float".

Each stage of the transceiver in FIG. 3 contains a pair of tristate drivers and receivers. Thus stage 1 contains a receiver RL1 and a driver DR1 for transferring data from line L1 to line D1, and a receiver RR1 and a Driver DL1 for transferring data in the other direction. Each receiver comprises two inverters in tandem (inverters 31 and 32 for receiver RL1). A special feature provides transmission gates such as gate arrangement GL1 at receiver RL1 which may be selectively enabled to take the data from either inverter of the receiver, so that the data from conductor L1 may be transferred to line D1 in either direct or (complementary) form.

The control circuits for FIG. 3 include an input lead EL to enable the drivers on the left, and an input lead ER to enable the drivers on the right, and an input lead F to control the transmission gates to select direct or complementary transmission. A "one" on lead EL or ER enables the corresponding drivers, while a "zero" provides the "float" state. Of course only one of the leads EL or ER is allowed to have a logic "one" at any time, although both may be "zero". A "one" at lead F causes inverted transmission, while a "zero" provides for direct transmission. Note that each driver by itself inverts the data, for example between points A and D for driver DR1.

The memory driver/receiver requirements are a chip size of 95 mil×115 mil, a geometry of 4 microns, a voltage operating range of 3 to 10 volts (5 volt-normal operating voltage), a characteristic source impedance of 100 ohms at $V_{DD}$ equal to 10 volts, and an operating temperature range of $-55°$ C. to 125° C.

Figure 4:
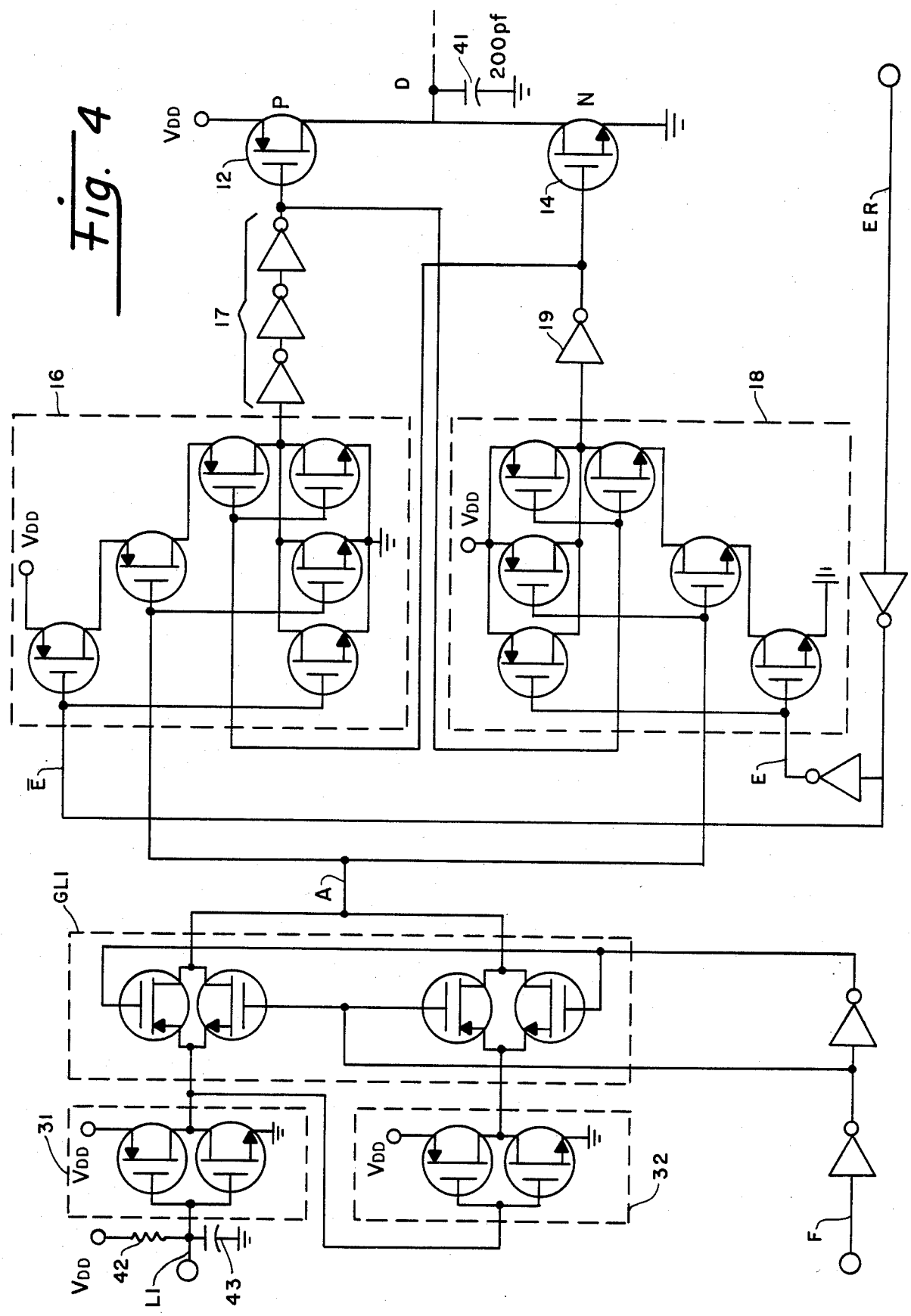
FIG. 4 is a schematic functional block diagram of one stage of the transceiver.

FIG. 4 is a schematic of the circuit used to do the transient analysis for the memory transceiver. The drawing in FIG. 4 shows one half of one stage, e.g., the receiver RL1 and the driver DR1, along with control logic comprising two inverters from the enable lead ER to leads $\overline{E}$ and E, and two inverters from lead F to the transmission gate arrangement GL1. Most of the inverters are shown as functional blocks, with inverters 31 and 32 of receiver RL1 shown schematically. The other inverters are similar. The figure also shows a 200-picofarad capacitor 41 connected to line D, for testing, which represents the capacitance of the line. A discrete capacitor is, of course, not used in the normal system connection. Likewise, the figure shows a resistor 42 and a capacitor 43 connected to line L1 for test purposes only.

Figure 5:
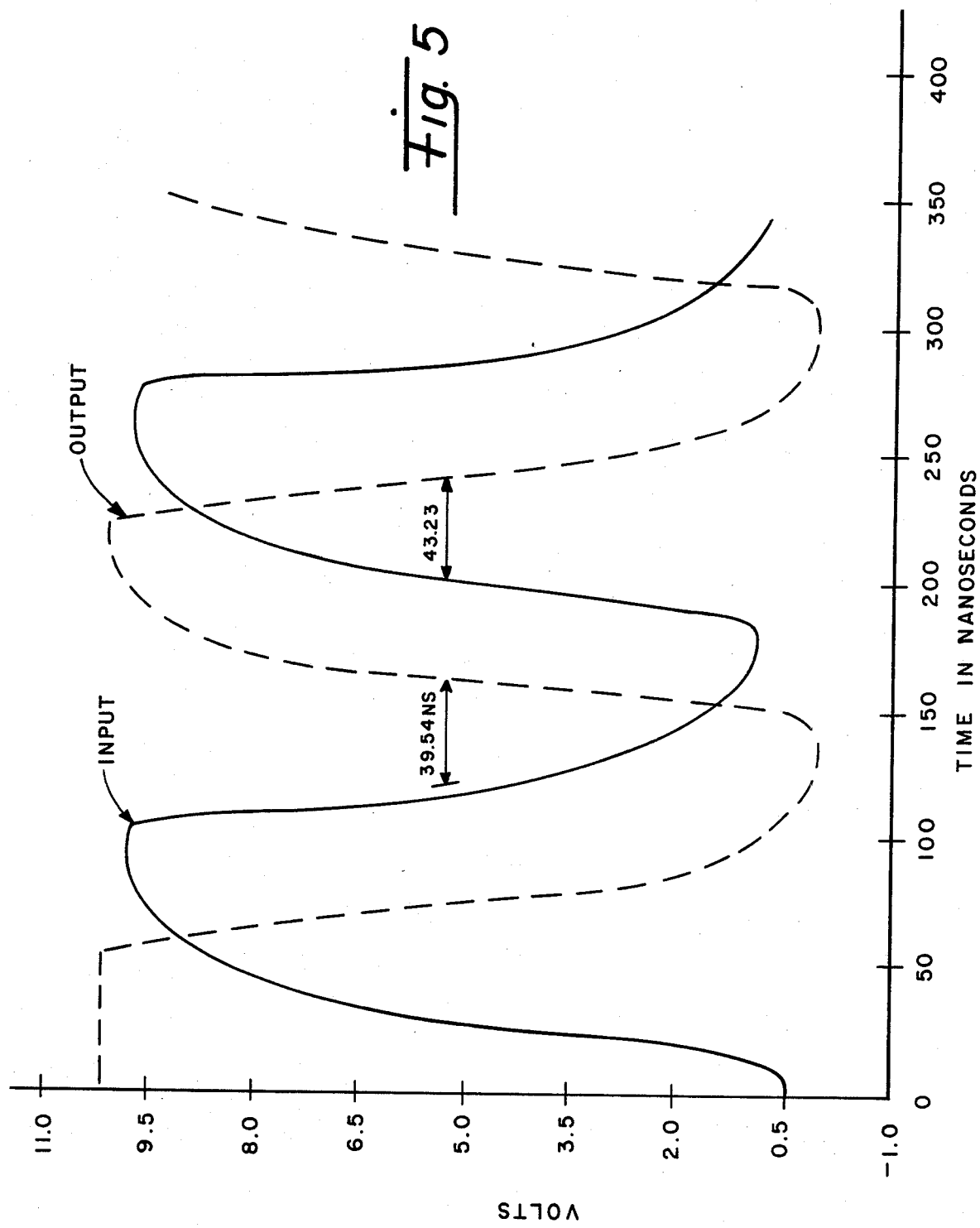

The analysis for a first test case shows the input and output waveforms in FIG. 5. Parameters used in this analysis are ten volts for $V_{DD}$, three point six micron gate lengths and a temperature of 125° C. Average delay from input L1 to output D is forty-one nanoseconds.

Figure 6:
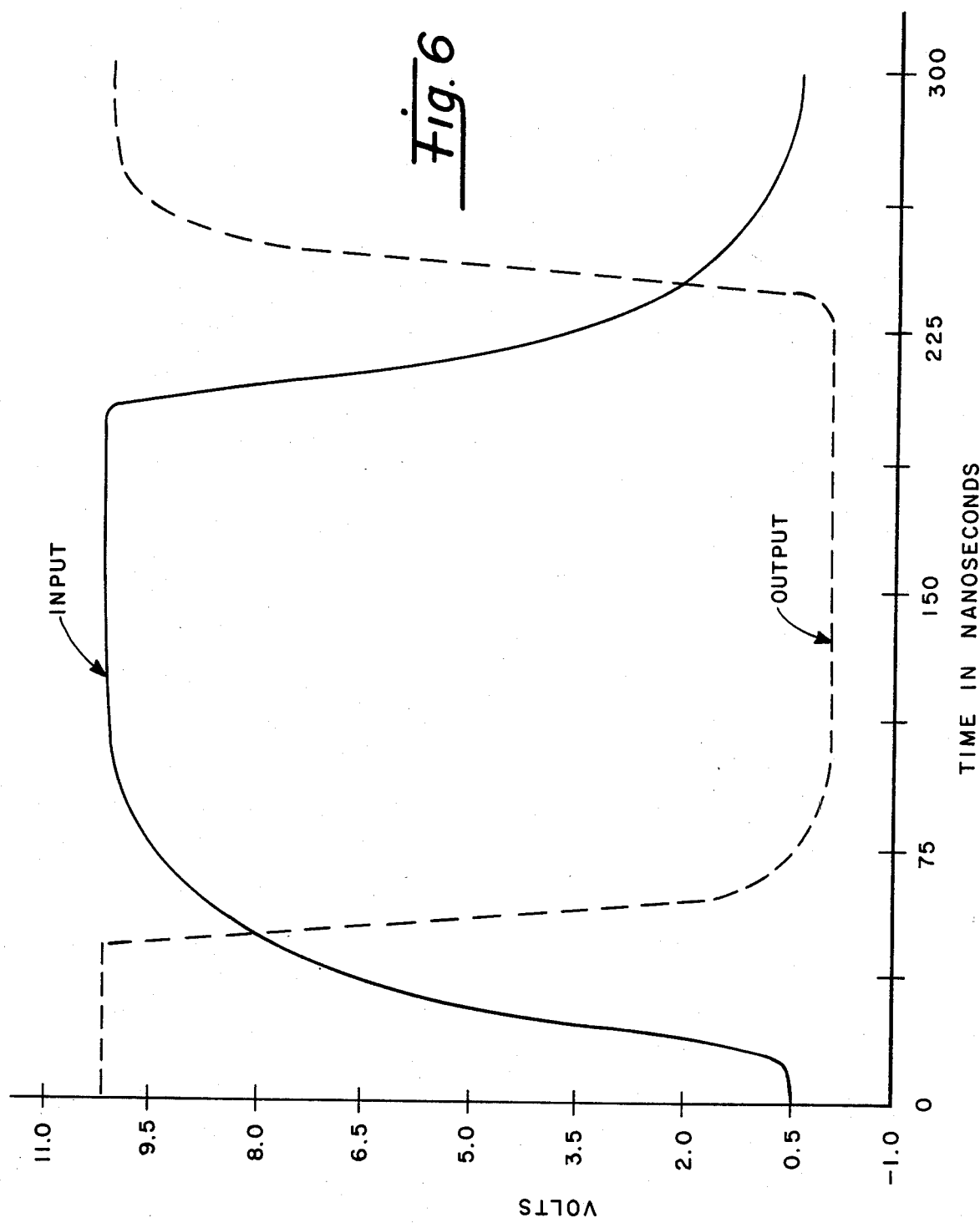
Figure 7:
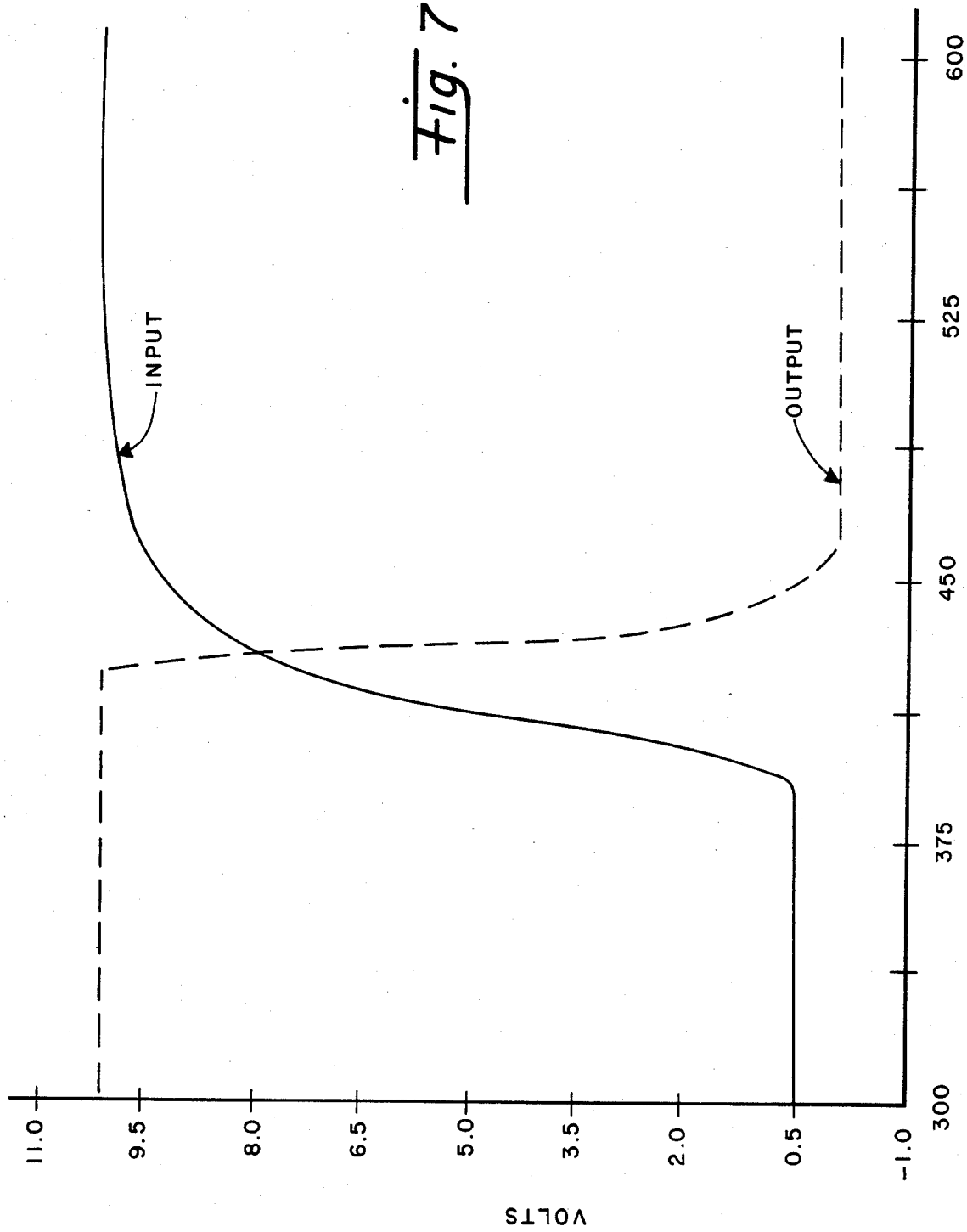

The analysis for a second test case shows the input and output waveforms in FIGS. 6 and 7 for the same circuit. Parameters used in this analysis are ten volts for $V_{DD}$, three point six micron gate lengths and a temperature of $-55°$ C. Average delay from input L1 to output D is twenty-three nanoseconds.

In the design of the memory transceiver, special care is taken in regard to power. The output driver is designed to ensure that the P-FET 12 and the N-FET 14 are not turned on at the same time causing unwanted power flow. Current through the output driver in FIG. 8 shows that when one FET is on the other FET is off ensuring that unwanted power is not burned.

As used herein and in the claims, an OR gate means is defined as any gate means whose output is high when at least one input is high, and low only when all inputs are low. An AND gate means is defined as any gate means whose output is high only when all inputs are high and low when at least one input is low. High and low refer to positive and negative (usually ground) potentials respectively.

Thus, while preferred constructional features of the invention are embodied in the structure illustrated herein, it is to be understood that changes and variations may be made by the skilled in the art without departing from the spirit and scope of my invention.

I claim:

1. A tristate driver circuit having first and second logic states which are approximately the potentials at the positive and negative poles of a direct-current bias supply and a "float" state which is an intermediate potential at high impedance, said driver circuit comprising a P-type and an N-type field effect transistors, each having a source, a drain and a gate terminal, with the drain terminals of both transistors connected to a driver output line, the source terminals of the P-type and the N-type transistors connected respectively to the positive and negative poles of the direct-current bias supply;

an OR gate means having three inputs, and having an output connected to the gate terminal of said P-type transistor, with the OR gate means comprising a NOR gate followed by an odd number of inverters;

an AND gate means having three inputs and having an output connected to the gate terminal of said N-type transistor, with the AND gate means comprising a NAND gate followed by an odd number of inverters;

wherein the NOR gate, the NAND gate, and each inverter comprises P-type and N-type field effect transistors, each transistor having source, gate, and drain electrodes, all of said transistors being part of a single integrated circuit chip;

said OR gate means and AND gate means each having its output connected to an input of the other;

an enable input coupled to an input of the AND gate means and inverted as an input of the OR gate means, so that in response to one signal condition at the enable input a first logic state is applied to the AND gate means, and thereby the outputs of the OR and AND gate means are at the first and second logic states respectively, to turn off both of said transistors regardless of the logic levels at the other inputs, to place said driver output line at the "float" state;

a driver input line connected to inputs of both the OR gate means and the AND gate means for supplying logic signals at the first and second states alternately, so that with an enable signal condition at the input, which provides a second logic state input signal to the OR gate means and a first logic state input signal to the AND gate means, the driver circuit repeats the logic signal from the driver input line in inverted form to the driver output line, the first state at the output line having the P-type transistor on and the N-type transistor off, and vice versa for the second state at the output line, and AND gate means and OR gate means each providing some delay effectively in tandem, so that in resonse to a change of state at the driver input line the transistor which is on is first turned off, and after a short delay the transistor which was off is turned on, so that during a change between the first and second logic states at the output there is a definite interval during which the output is at the high-impedance "float" state.

* * * * *

UNITED STATES PATENT AND TRADEMARK OFFICE
CERTIFICATE OF CORRECTION

PATENT NO. : 4,540,904

DATED : September 10, 1985

INVENTOR(S) : John J. Ennis et al

It is certified that error appears in the above-identified patent and that said Letters Patent is hereby corrected as shown below:

Claim 1, line 33 (col. 5, line 22)

before "AND" insert ---OR gate means and a second logic state is applied to the---.

Signed and Sealed this

Fourth Day of February 1986

[SEAL]

Attest:

Attesting Officer

DONALD J. QUIGG

Commissioner of Patents and Trademarks